United States Patent
Park

(10) Patent No.: US 7,569,429 B2
(45) Date of Patent: Aug. 4, 2009

(54) ANTIFUSE HAVING UNIFORM DIELECTRIC THICKNESS AND METHOD FOR FABRICATING THE SAME

(75) Inventor: Keun Soo Park, Bucheon-si (KR)

(73) Assignee: Dongbu Electronics Co., Ltd., Seoul (KR)

( * ) Notice: Subject to any disclaimer, the term of this patent is extended or adjusted under 35 U.S.C. 154(b) by 292 days.

(21) Appl. No.: 11/324,006

(22) Filed: Dec. 29, 2005

(65) Prior Publication Data

US 2006/0145292 A1 Jul. 6, 2006

(30) Foreign Application Priority Data

Dec. 31, 2004 (KR) ............... 10-2004-0117664

(51) Int. Cl.
*H01L 21/82* (2006.01)
(52) U.S. Cl. ............... 438/131; 438/600; 257/E21.592
(58) Field of Classification Search ............... 438/600, 438/131
See application file for complete search history.

(56) References Cited

U.S. PATENT DOCUMENTS

| | | | |
|---|---|---|---|
| 5,233,217 A * | 8/1993 | Dixit et al. ............... | 257/530 |
| 5,322,812 A * | 6/1994 | Dixit et al. ............... | 438/600 |
| 5,525,830 A | 6/1996 | Chen et al. | |
| 5,614,756 A | 3/1997 | Forouhi et al. | |
| 5,639,684 A * | 6/1997 | Kwok ............... | 438/600 |
| 5,882,997 A * | 3/1999 | Sur et al. ............... | 438/600 |
| 6,057,589 A * | 5/2000 | Look et al. ............... | 438/600 |
| 6,097,077 A * | 8/2000 | Gordon et al. ............... | 438/600 |
| 6,261,937 B1 * | 7/2001 | Tobben et al. ............... | 438/601 |
| 6,580,144 B2 * | 6/2003 | Anthony ............... | 438/600 |
| 6,773,967 B1 * | 8/2004 | Liu ............... | 438/600 |

OTHER PUBLICATIONS

Shih, Chih-Ching et al., Characterization and Modeling of a Highly Reliable Metal-to-Metal Antifuse for High-Performance and High-Density Field-Programmable Gate Arrays, IEEE International Reliability Physics Proceedings, 1997, 25-33, The Societies, Piscataway, N.J.
Zhang, G. et al., On-State Reliability of Amorphous Silicon Antifuses, IEDM Technical Digest, 1995, 551-554, Institute of Electrical & Electronics Engineers, Piscataway, N.J.
Wong, Richard J. et al., Reliability Mechanism of the Unprogrammed Amorphous Silicon Antifuse, IEEE International Reliability Physics Proceedings, 1994, 378-382, The Societies, Piscataway, N.J.

* cited by examiner

*Primary Examiner*—W. David Coleman
*Assistant Examiner*—Sun M Kim
(74) *Attorney, Agent, or Firm*—The Law Offices of Andrew D. Fortney; Andrew D. Fortney; William E. Brow

(57) ABSTRACT

Disclosed are an antifuse having a uniform amorphous silicon (antifuse material) thickness and a method for fabricating such an antifuse device. The antifuse is located between overlying and underlying conductive layers, and includes: a contact and/or via hole in an insulating layer on the underlying conductive layer; a lower metal layer contacting inner surfaces of the contact and/or via hole and a top surface of the insulating layer; a filling layer contacting the lower barrier metal layer and at least partially filling the contact and/or via hole; an antifuse material layer contacting a top surface of the filling layer and a part of the lower metal layer; and an upper metal layer on the antifuse material layer.

20 Claims, 5 Drawing Sheets

ANTIFUSE HAVING UNIFORM DIELECTRIC THICKNESS AND METHOD FOR FABRICATING THE SAME

CROSS-REFERENCE TO RELATED APPLICATION

This application claims priority to and the benefit of Korean Patent Application No. 10-2004-117644, filed in the Korean Intellectual Property Office on Dec. 31, 2004, the entire contents of which are incorporated herein by reference.

BACKGROUND OF THE INVENTION

1. Field of the Invention

The present invention relates to an antifuse device having a uniform antifuse material thickness and a method for fabricating the same.

2. Description of the Related Art

Field programmable gate arrays (FPGAs) that can be programmed by users to implement virtually any set of functions sometimes employ antifuse devices for programmable elements. Antifuse devices generally include a pair of conductive electrodes separated by a dielectric layer. Amorphous silicon or α-silicon is frequently used for the dielectric layer, and thus prior to programming, the antifuse tends to exhibit very high resistance (typically $>10^9$ $\Omega$) between the two electrodes. In a programming process, a predetermined voltage (the program voltage) is applied to the antifuse to break-down the dielectric material and create a low-impedance connection between the two conductive electrodes. Impedance of higher than $10^9$ $\Omega$ may be reduced to about 20-50 $\Omega$ by the programming process.

The amorphous silicon based antifuse devices are easily programmed and exhibit great difference in impedance before and after programming, and are thus widely used in semiconductor devices such as programmable read only memory (PROM), programmable array logic (PAL), and FPGA devices.

Studies for reliability of programmed and unprogrammed α-silicon antifuses include: R. J. Wong and K. E. Gordon, "Evaluating the Reliability of the QuickLogic Antifuse", Electronics Engineering, pp. 49-55 (June, 1992); and R. J. Wong and K. E. Gordon, "Reliability Mechanism of the Unprogrammed Amorphous Silicon Antifuse", IEEE International Reliability Physics Proceedings, pp. 378-383 (1994). For integrity of low impedance of programmed antifuse, refer to: G Zhang, Y King, S. Eltoukhy, E. Handy, T. Jing, P. Yu, and C. Hu, "On-State Reliability of Amorphous Silicon Antifuses", IEDM, pp. 551-554 (1995); or C. Shih et al., "Characterization and Modeling of a Highly Reliable Metal-to-Metal Antifuse for High-Performance and High-Density Field-Programmable Gate Array", IEEE International Reliability Physics Proceedings, pp. 25-33 (1997).

In the antifuse device, the thickness of amorphous silicon is critical as the magnitude of program voltage needed to program the antifuse depends on it. In particular, the uniformity of the thickness of amorphous silicon has a significant effect on the reliability and yield of the programmable semiconductor devices. Generally, tens of millions of antifuses are fabricated in a single wafer. When amorphous silicon for the antifuse material is not deposited uniformly across the entire wafer, the program voltage may increase or decrease from place to place on the wafer. The variation in the antifuse material across the wafer is one reason for the variation in antifuse programming voltage. The range of programming voltages demonstrated by the antifuses is called the programming voltage distribution, which should be kept as tight or as small as possible for ensuring the reliability and yield of the semiconductor devices. Achieving a high uniformity of the antifuse material, amorphous silicon, is particularly difficult when it is deposited on an uneven surface such as in contact and/or via holes.

SUMMARY OF THE INVENTION

It is an object of the present invention to provide an antifuse device having a uniform antifuse material thickness and a method for fabricating the same.

Another object of the present invention is to provide a much tighter (or smaller) program voltage distribution in programmable semiconductor devices.

Still another object of the present invention to improve the reliability and yield of programmable semiconductor devices.

In a first aspect, embodiments of the present invention may be directed to an antifuse between overlying and underlying conductive layers and comprising: a contact and/or via hole in an insulating layer on the underlying conductive layer; a lower (barrier) metal layer contacting an inner surface of the contact and/or via hole and top surface of the insulating layer; a filling layer contacting the lower metal layer and at least partially filling the contact and/or via hole; an antifuse material (e.g., amorphous silicon) layer contacting a top surface of the filling layer and a part of the lower metal layer; and an upper (barrier) metal layer on the antifuse material layer.

Preferably, the filling layer comprises tungsten and has a recess that may be formed by depositing tungsten on a substrate or wafer (e.g., onto the lower metal layer), planarizing the tungsten (e.g., by chemical mechanical polishing, or CMP) to remove the tungsten from outside the contact and/or via hole, and etching part of the remaining tungsten using an etchant and/or cleaner comprising $H_2O_2$ to form the recess. The filling layer thus may partly fill the contact and/or via hole and compensate for the relatively high step coverage of the surface on which the amorphous silicon layer is formed. Therefore, the uniformity of the antifuse material (amorphous silicon) thickness can be improved and/or ensured. Further, since the recess in the filling layer may have a predetermined depth, the amorphous silicon layer may contact both lower and upper metal layers to facilitate the formation of a silicide (e.g., titanium silicide) with the lower and/or upper metal layer(s).

These and other aspects of embodiments of the invention will become evident by reference to the following description of embodiments, often referring to the accompanying drawings.

DETAILED DESCRIPTION OF EMBODIMENTS OF THE INVENTION

Hereinafter, preferred embodiments of the present invention will be described with reference to the accompanying drawings.

Figure 1:
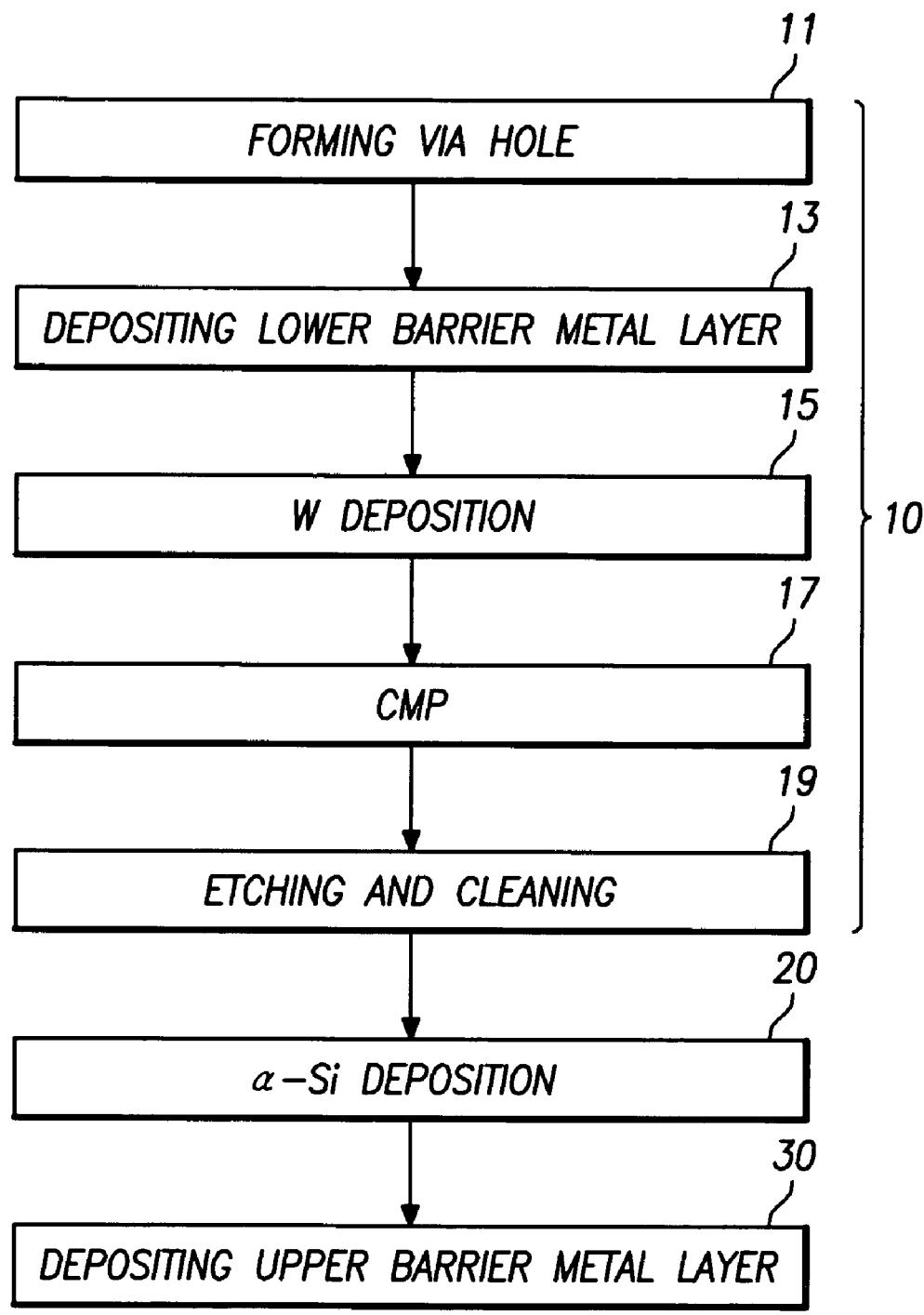
FIG. 1 is a flow chart for illustrating the process(es) for fabricating antifuse devices according to the present invention.

Referring to FIG. 1, a method for fabricating an antifuse according to the present invention may include contact forming step 10, antifuse material deposition step 20, and upper metal layer deposition step 30. In the contact forming step 10, a base for a programmable (or potential) connection structure (or antifuse) between overlying and underlying conductive layers that can be interconnected by the antifuse is formed. The overlying conductive layer may comprise a polysilicon layer (which may further have a metal silicide layer thereon) or a lower metal layer, and the underlying conductive layer may comprise an impurity diffusion layer (e.g., a source and/or drain terminal of a CMOS transistor, a base/emitter/collector terminal of a bipolar transistor, a buried bit line or word line in a memory, an electrode in a capacitor or an electrical connection thereto, etc.), a polysilicon layer (which may further have a metal silicide layer thereon) or an upper metal layer.

The contact forming step 10 includes via hole forming step 11, lower metal layer deposition step 13, tungsten deposition step 15, a step 17 for planarizing the deposited tungsten, and a step 19 for forming or a recess in the planarized tungsten, thus forming a contact or filling layer ('60' of FIG. 2e), generally by etching (and optionally cleaning) the planarized tungsten layer.

Figure 2A:
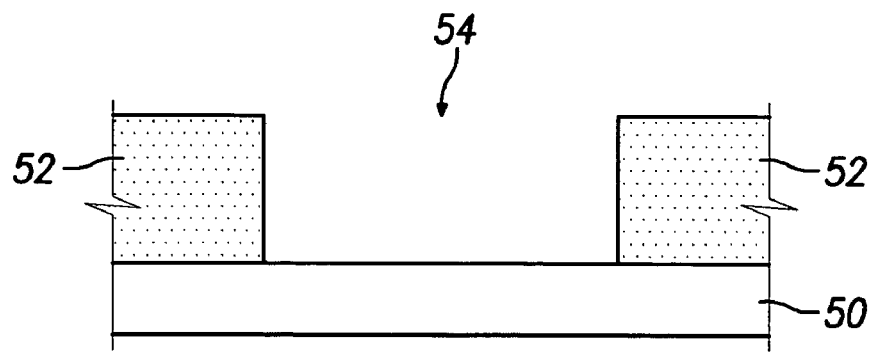
FIG. 2a is a cross-sectional view of a substrate in which an insulating layer is selectively etched to form a contact and/or via hole.

In the via hole forming step 11, and referring now to FIG. 2A, insulating layer 52 formed on underlying substrate layer 50 is selectively etched (e.g., by photolithographic patterning of a photoresist on insulating layer 52, and etching insulating layer 52 using the patterned photoresist as a mask) to form a contact and/or via 54. As explained above, the underlying layer 50 may comprise a metal layer (e.g., an aluminum metal layer, which may have adhesive and/or barrier layers above and/or below the bulk aluminum and/or an antireflective layer above the bulk aluminum, such as a Ti adhesive layer/TiN barrier layer/bulk Al or Al—Cu alloy [containing 0.5-4.0 wt. % Cu]/Ti adhesive layer/TiN or TiW alloy barrier and/or antireflective layer) or impurity diffusion layer (e.g., an area in which a predetermined dose of impurity ions such as B, P or As have been implanted at a predetermined energy into a single-crystal silicon substrate or an epitaxial Si or SiGe layer), and the insulating layer 52 may comprise a silicon oxide layer (such as silicon rich oxide, or SRO), a silicon dioxide layer (such as undoped silicate glass, or USG; a silane- or TEOS-based oxide; etc.), an oxide-nitride-oxide (ONO) dielectric layer, BPSG (borophosphosilicate glass) layer, or PSG (phosphosilicate glass) layer. The insulating layer 52 may be formed by PECVD (Plasma Enhanced Chemical Vapor Deposition), LPCVD (Low Pressure CVD), or APCVD (Atmospheric Pressure CVD). The contact and/or via hole 54 may be formed by a conventional photolithographic process comprising depositing a photoresist (not shown) on the insulating layer 52, exposing and developing the photoresist with a photomask that has one or more via patterns therein, and either selectively lifting-off the photoresist and insulating layer or etching the insulating layer 52 using the patterned photoresist as an etching mask.

Figure 2B:
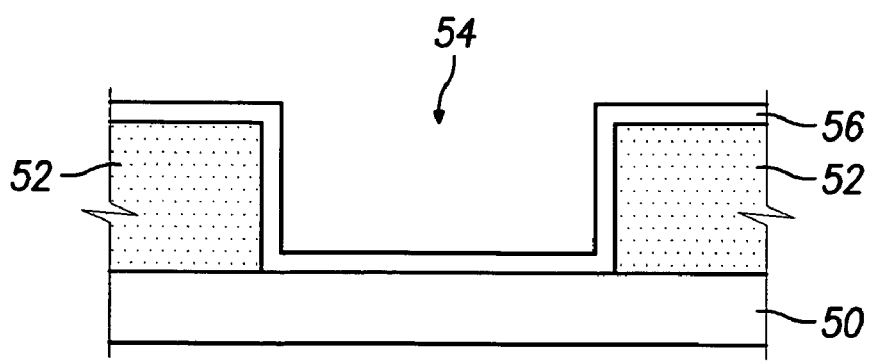
FIG. 2b is a cross-sectional view of a substrate in which a lower barrier metal layer is formed to cover the side and bottom surfaces of the contact and/or via hole and the top surface of the insulating layer.

Referring to FIG. 2B, a lower metal layer 56 is formed to cover the side and bottom surfaces of contact and/or via hole 54 and the top surface of the insulating layer 52. The lower metal layer 56 may prevent unwanted chemical reaction between the underlying layer 50 and a tungsten metal layer 58 deposited in step 15 of FIG. 1. Thus, lower metal layer 56 may provide a diffusion barrier function. Further, the lower metal layer 56 functions as a bottom electrode of the antifuse device by lowering the contact resistance and improving the conductivity with the underlying layer 50 that directly contacts the metal layer 56. A titanium base compound and/or metal (e.g., a conventional Ti/TiN bilayer) may be used for the lower barrier metal layer 56. Thus, lower metal layer 56 may comprise an adhesive metal layer (e.g., Ti) with a barrier layer (e.g., TiN) thereon.

Figure 2C:
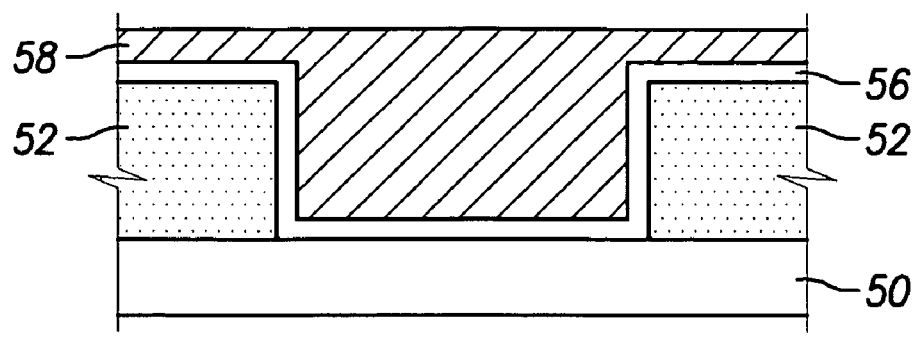
FIG. 2c is a cross-sectional view of a substrate in which a filling material (e.g., tungsten) is deposited on the substrate or wafer.

After forming the lower metal layer 56, tungsten 58 is deposited on the overall surface of (e.g., blanket deposited on) the substrate or wafer (see step '15' of FIG. 1) as shown in FIG. 2C. Tungsten has advantages in that the processing time is short, efficiency in filling the contact and/or via is excellent, resistance variations are small as compared to aluminum, and the process for forming such an intermetal interconnection is relatively well-known. However, the metal layer 58 of the present invention is not limited to tungsten, and those skilled in the art may well understand that other metals having functionally similar or equivalent features may be employed for the layer 58.

Figure 2D:
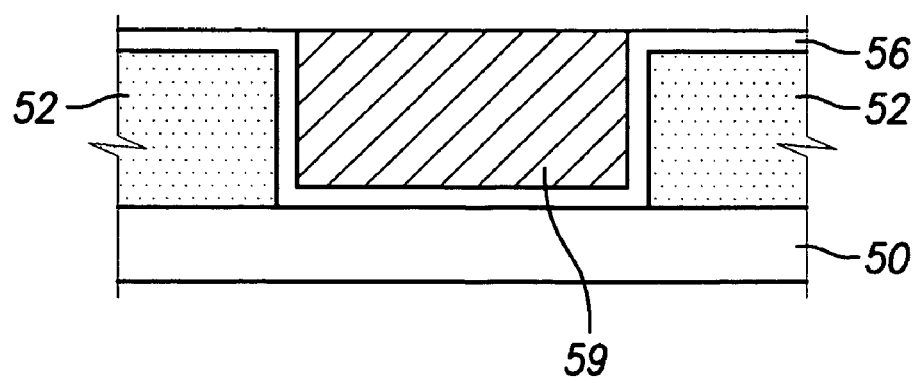
FIG. 2d is a cross-sectional view of a substrate in which the tungsten is planarized to remove it from outside the contact hole (e.g., so that the tungsten remains substantially within the contact and/or via hole).

Referring to FIG. 2D, a planarization process is carried out to remove the tungsten 59 from areas of the substrate other than that of the contact and/or via hole 54 (step '17' of FIG. 1) by, e.g., chemical mechanical polishing (CMP).

Figure 2E:
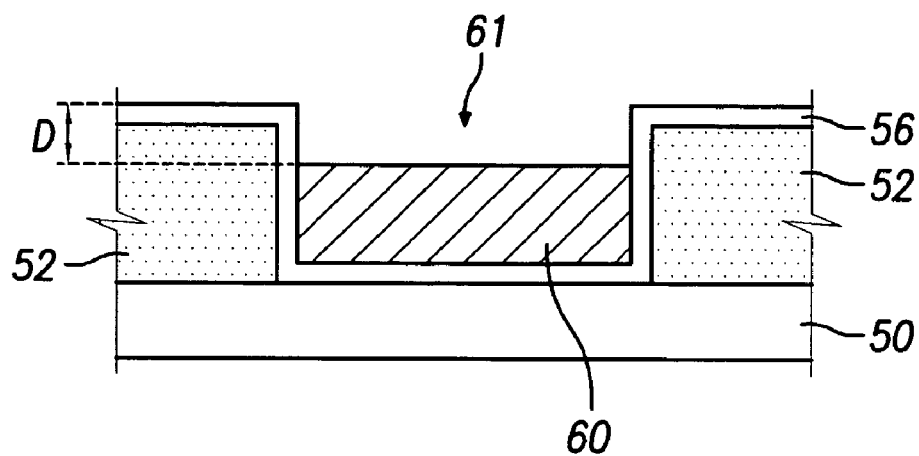
FIG. 2e is a cross-sectional view of a substrate in which the planarized tungsten is etched to form a recess.

In FIG. 2E, the planarized (and/or remaining) tungsten metal 59 is etched and optionally, although preferably, cleaned (see step '19' of FIG. 1) to form a recess 61 having a predetermined depth as denoted by 'D'. The recess 61 may be formed by selectively etching the tungsten metal layer 59 with an etchant and/or cleaner comprising $H_2O_2$ (e.g., a conventional wet $H_2O_2$-based etching and/or cleaning solution). Alternatively, etching the tungsten or other filling material 59 may comprise selective reactive ion etching or selective anisotropic plasma etching (e.g., selectively etching tungsten relative to other exposed materials, such as lower metal layer 56 and/or insulating layer 52, if insulating layer 52 is exposed following planarization of the tungsten or other filling material 59).

The tungsten metal layer having the recess 61 may thus partially fill the contact and/or via hole 54 and be called a 'filling layer' 60 as denoted in FIG. 2E. The magnitude or depth of recess 61, which determines the step coverage of amorphous silicon, may range e.g., from 500 to 5,000 Å. When the magnitude of recess 61 exceeds 5,000 Å, it is difficult to obtain a preferable step coverage for amorphous silicon.

Figure 2F:
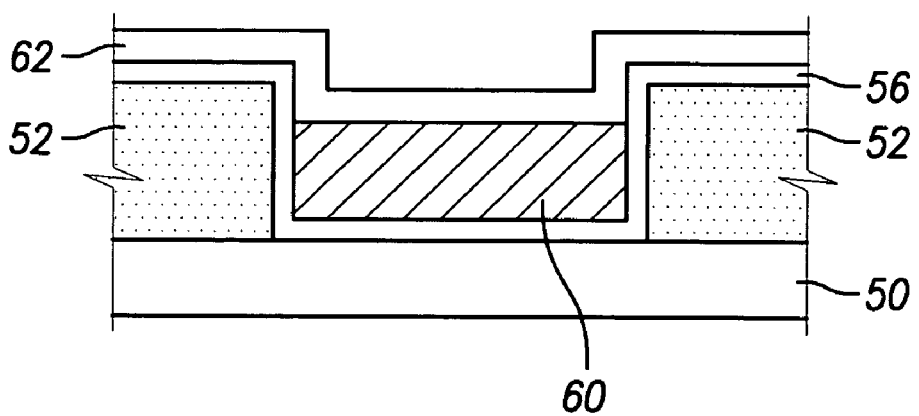
FIG. 2f is a cross-sectional view of the substrate in which an amorphous silicon layer is formed on the filling layer.

Referring to FIG. 2F, a dielectric or amorphous silicon layer 62 is deposited on the substrate having the filling layer 60. The dielectric layer 62, e.g., comprising amorphous silicon or hydrogenated amorphous silicon, covers the bottom surface of recess 61 (i.e., the upper surface of filling layer 60), the side surface of recess 61 and the top surfaces of insulating layer 52 or lower metal layer 56 where it overlies insulating layer 52. Amorphous silicon layer 61 may be deposited by PECVD or LPCVD, and generally has a thickness ranging, e.g., from 400 to 1,000 Å (e.g., when deposited by PECVD or LPCVD). Amorphous silicon layer 61 may have a thickness of less than 400 Å (e.g., from 20 to 200 Å) when deposited by atomic layer deposition (ALD).

Figure 2G:
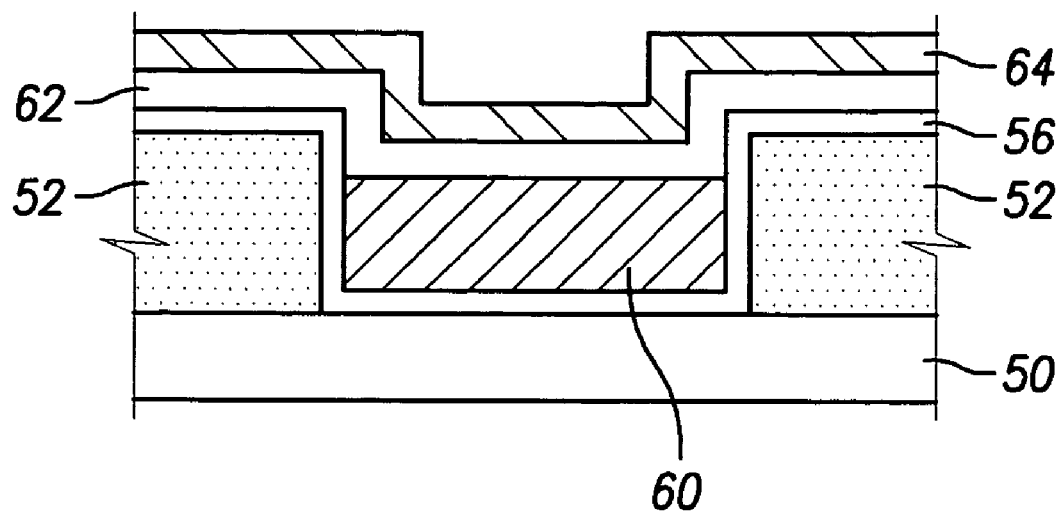
FIG. 2g is a cross-sectional view of an exemplary antifuse according to the present invention in which an upper metal layer is deposited on the amorphous silicon layer.

Referring to FIG. 2G, upper metal layer 64 is deposited on the amorphous silicon layer 62. The upper metal layer 64, like the lower metal layer 56, may function as both a chemical diffusion barrier and a conductive path, and may also comprise a titanium based material (e.g., a Ti/TiN bilayer as described above) and be deposited by, e.g., sputtering or CVD.

In another embodiment of the present invention, the upper metal layer 64 may have a stacked structure comprising titanium, aluminum and titanium (and/or titanium compound) layers, as described above. On the upper metal layer 64 is generally deposited an overlying layer (not shown) comprising, e.g., an aluminum metal (or Al—Cu alloy) layer or a polysilicon layer (that may further comprise a metal silicide layer thereon) that is electrically interconnected to the underlying layer 50 when the antifuse is programmed.

As shown in FIG. 2G, the antifuse device of the present invention comprises a lower metal layer 56 that may contact inner walls of the contact and/or via hole 54, a filling layer 60, a recess 61 (see FIG. 2E), an amorphous silicon (or other antifuse material) layer 62, and an upper metal layer 64. Here, the filling layer 60 may comprise tungsten and generally does not completely fill the contact and/or via hole 54, but rather, may have a recess 61 having a predetermined depth 'D' that is unfilled. Therefore, the amorphous silicon layer 62 may contact the lower metal layer 56 both outside and inside the via hole 54. Further, the amorphous silicon layer 62 generally has a top surface contacting the upper metal layer 64.

According to the present invention, it is possible to form a metal silicide (e.g., titanium silicide) at an interface between the upper and/or lower metal layer(s) 56 and/or 64 with the amorphous silicon layer 62 when the program voltage is applied to the antifuse device for programming. Also, since the filling layer 60 may comprise tungsten within the contact and/or via hole 54, the antifuse material (e.g., amorphous silicon) may be deposited in a shallow recess 61, rather than along relatively deep (and/or high aspect ratio) inner walls of the contact and/or via hole 54 (see, e.g., FIGS. 2A-2B), and thus a more uniform thickness of the deposited amorphous silicon may be obtained and/or ensured.

With the compensation of the step coverage due to the via hole, the program voltage distribution can be kept much tighter, and the reliability and yield of the programmable semiconductor devices can be greatly enhanced.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. A method for fabricating an antifuse, said method comprising steps of:
    forming a contact and/or via hole in an insulating layer on an underlying conductive layer;
    forming a lower metal layer that contacts inner surfaces of the contact and/or via hole and a top surface of the insulating layer and that partially fills said contact and/or via hole;
    forming a filling layer on the lower metal layer, wherein the filling layer partially fills the contact and/or via hole such that a recess having a predetermined depth is formed in said contact and/or via hole;
    forming an antifuse material layer that contacts an upper surface of the filling layer and an inner surface of the lower metal layer in said contact and/or via hole, wherein the antifuse material layer contacts the lower metal layer at both an external region and an internal region of said contact and/or via hole; and
    forming an upper metal layer on the antifuse material layer.

2. The method of claim 1, wherein forming the antifuse material layer at least partially fills said recess in the contact and/or via hole.

3. The method of claim 1, wherein the step of forming the filling layer includes the steps of:
    depositing a tungsten layer sufficiently to fill the contact and/or via hole and cover the lower metal layer;
    planarizing the tungsten layer to remove tungsten from areas other than the contact and/or via hole; and
    etching the remaining tungsten layer to form said recess in the contact and/or via hole.

4. The method of claim 3, wherein etching the tungsten layer comprises wet etching with an etchant and/or cleaner comprising $H_2O_2$.

5. The method of claim 3, wherein forming said antifuse material layer comprises covering an upper surface of said filling layer, a side surface of said recess, and a top surface of said insulating layer.

6. The method of claim 5, wherein forming the antifuse material layer at least partially fills said recess in the contact and/or via hole.

7. The method of claim 1, wherein the antifuse material layer comprises amorphous silicon.

8. The method of claim 7, wherein forming the antifuse material layer comprises depositing the amorphous silicon by chemical vapor deposition.

9. The method of claim 1, wherein each of the lower and upper metal layers comprise titanium.

10. The method of claim 1, wherein the lower metal layer provides a diffusion barrier function.

11. The method of claim 10, wherein the upper metal layer provides a diffusion barrier function.

12. The method of claim 1, wherein the upper metal layer provides a diffusion barrier function.

13. The method of claim 1, wherein each of the lower and upper metal layers comprise an adhesive metal layer and a baffler layer.

14. The method of claim 13, wherein said adhesive metal layer comprises titanium.

15. The method of claim 13, wherein said baffler layer comprises titanium nitride.

16. The method of claim 1, further comprising depositing an overlying layer on said upper metal layer.

17. The method of claim 16, further comprising programming the antifuse, thereby electrically interconnecting said overlying layer to said underlying conductive layer.

18. The method of claim 16, wherein said overlying layer comprises one or more materials selected from the group consisting of aluminum, copper, polysilicon and metal silicides.

19. The method of claim 1, further comprising forming the insulating layer on the underlying conductive layer.

20. The method of claim 19, wherein the insulating layer comprises one or more materials selected from the group consisting of silicon rich oxide (SRO), silicon dioxide, undoped silicon glass (USG), silane-based oxide, TEOS-based oxide, oxide-nitride-oxide (ONO), borophosphosilicate glass (BPSG), and phosphosilicate glass (PSG).

* * * * *